United States Patent
Nozawa et al.

(10) Patent No.: US 8,709,681 B2
(45) Date of Patent: Apr. 29, 2014

(54) MASK BLANK, TRANSFER MASK, AND FILM DENSENESS EVALUATION METHOD

(75) Inventors: Osamu Nozawa, Tokyo (JP); Kazuya Sakai, Tokyo (JP)

(73) Assignee: Hoya Corporation, Tokyo (JP)

( * ) Notice: Subject to any disclaimer, the term of this patent is extended or adjusted under 35 U.S.C. 154(b) by 133 days.

(21) Appl. No.: 13/264,664

(22) PCT Filed: Apr. 9, 2010

(86) PCT No.: PCT/JP2010/056409
§ 371 (c)(1),
(2), (4) Date: Oct. 14, 2011

(87) PCT Pub. No.: WO2010/119811
PCT Pub. Date: Oct. 21, 2010

(65) Prior Publication Data
US 2012/0034434 A1    Feb. 9, 2012

(30) Foreign Application Priority Data

Apr. 16, 2009    (JP) .................................. 2009-100050

(51) Int. Cl.
*G03F 1/50*    (2012.01)
(52) U.S. Cl.
USPC ............................................................. 430/5
(58) Field of Classification Search
USPC ................. 430/5; 428/428, 430; 378/35
See application file for complete search history.

(56) References Cited

U.S. PATENT DOCUMENTS

| | | | |
|---|---|---|---|
| 5,919,321 A * | 7/1999 | Hirakawa ...................... 148/423 |
| 7,618,753 B2 | 11/2009 | Yoshikawa et al. | |
| 7,906,259 B2 * | 3/2011 | Hayashi et al. .................... 430/5 |
| 2002/0039689 A1 | 4/2002 | Yusa et al. | |
| 2002/0068228 A1 | 6/2002 | Kureishi et al. | |

FOREIGN PATENT DOCUMENTS

| | | |
|---|---|---|
| JP | S64-7042 A | 1/1989 |
| JP | 2001-312043 A | 11/2001 |
| JP | 2002-156742 A | 5/2002 |
| JP | 2002-169265 A | 6/2002 |
| JP | 2005-156700 A | 6/2005 |
| JP | 2006-078825 A | 3/2006 |
| JP | 2007-271891 A | 10/2007 |
| WO | 2008/139904 A1 | 11/2008 |

OTHER PUBLICATIONS

Japanese Office Action dated Aug. 21, 2013, issued in Japanese Patent Application No. 2011-509271.

* cited by examiner

*Primary Examiner* — Stephen Rosasco
(74) *Attorney, Agent, or Firm* — Sughrue Mion, PLLC

(57) ABSTRACT

A relative density of a light-shielding film made of MoSi, which is given by relative density=(actual density/theoretical density)×100, is obtained using a density (actual density) calculated by an XRR method and a theoretical density obtained from a material composition. By obtaining a dense film having a relative density greater than 94%, the thickness of an altered layer, caused by exposure light, at a surface of the MoSi film can be made not more than 2.0 nm so that the dimensional change of a transfer pattern can be made small.

14 Claims, 3 Drawing Sheets

(1)

(2)

US 8,709,681 B2

MASK BLANK, TRANSFER MASK, AND FILM DENSENESS EVALUATION METHOD

CROSS REFERENCE TO RELATED APPLICATIONS

This application is a National Stage of International Application No. PCT/JP2010/056409, filed on Apr. 9, 2010, which claims priority from Japanese Patent Application No. 2009-100050, filed Apr. 16, 2009, the contents of all of which are incorporated herein by reference in their entirety.

TECHNICAL FIELD

This invention relates to a transfer mask for use as a mask in transferring a fine pattern in the manufacture of a semiconductor device, to a mask blank as an intermediate product that can be formed into the transfer mask by applying certain processing treatments thereto, and to a film denseness evaluation method for evaluating the denseness of a thin film formed therein.

BACKGROUND ART

Fine pattern formation is carried out by the photolithography in manufacturing processes of a semiconductor device. A number of substrates called transfer masks are normally used for this fine pattern formation. The transfer mask comprises generally a transparent glass substrate having thereon a fine pattern made of a metal thin film or the like. The photolithography is used also in the manufacture of the transfer mask.

In the manufacture of a transfer mask by the photolithography, use is made of a mask blank having a thin film (e.g. a light-shielding film or the like) for forming a transfer pattern (mask pattern) on a transparent substrate such as a glass substrate. The manufacture of the transfer mask using the mask blank is carried out by forming a required fine pattern in a resist film coated on the mask blank and etching the thin film according to the resist pattern. Therefore, the properties of the thin film formed in the mask blank as an intermediate product almost exactly determine the performance of the transfer mask.

In recent years, the miniaturization of patterns has advanced more and more and, following it, the wavelength of an exposure light source for use has been shortened from a KrF excimer laser (wavelength 248 nm) to an ArF excimer laser (wavelength 193 nm). The miniaturization of transfer patterns is also significant. Patent Document 1 points out that a reduction in the thickness of a resist film is necessary for dealing with the miniaturization of a transfer pattern. It further describes that since a material composed mainly of chromium, which has conventionally been used as a transfer-pattern thin film, is dry-etched with a chlorine-based gas containing oxygen, a resist pattern also tends to be damaged during the etching and thus that it is difficult to reduce the thickness of the resist. Taking this into account, it proposes a laminated structure in which tantalum or molybdenum silicide that can be dry-etched with a fluorine-based gas is used as a material of a transfer-pattern thin film adapted to be capable of dealing with the reduction in the thickness of the resist and in which there is further provided a thin film of chromium or the like having high etching selectivity against the fluorine-based gas, i.e. a so-called hard mask film. By the use of this laminated structure, pattern transfer to the transfer-pattern thin film can be carried out by dry etching using the hard mask film as a mask and, therefore, it is sufficient for the thickness of the resist film to be large enough to carry out pattern transfer to the hard mask film. By the use of such a laminated structure of the thin film for transfer pattern formation and the hard mask film, the thickness of the resist can be more reduced than the case of direct transfer to the thin film composed mainly of chromium using the resist film as a mask and, therefore, the effect is obtained to some degree.

On the other hand, in a halftone phase shift mask blank, a material containing a metal silicide, such as a MoSiOC film described in Patent Document 2, has hitherto been widely used as a phase shift film which is a film for forming a transfer pattern in the manufacture of a mask. On the other hand, in a transfer mask, the in-plane dimensional uniformity of a transfer pattern is important for obtaining a required transfer result on a wafer. According to Roadmap ITRS 2008 update published by the International Semiconductor Roadmap Committee, the dimensional uniformity of a mask pattern is required to be 2.0 nm or less in the mask plane in the lithography of less than 45 nm DRAM half-pitch.

PRIOR ART DOCUMENT

Patent Document

Patent Document 1: JP-A-2006-78825
Patent Document 2: JP-A-2002-156742

SUMMARY OF INVENTION

Problem to be Solved by the Invention

Since the transfer mask manufacturing cost has been significantly increasing following the pattern miniaturization in recent years, there is an increasing need for a longer lifetime of a transfer mask.

As a factor for determining the lifetime of a transfer mask, there is a problem of mask degradation caused by the repeated cleaning of the photomask. Conventionally, for example, when haze (foreign matter composed mainly of ammonium sulfide and generated on the mask) is generated, cleaning is carried out for removing the haze so that a film loss (film dissolution) due to the cleaning cannot be avoided, and therefore, roughly, the number of times of cleaning determines the lifetime of the transfer mask.

In recent years, since the number of times of mask cleaning is reduced due to an improvement to haze, the period of time of the repeated use of a mask is prolonged and thus the time of cumulative exposure to a thin film having a transfer pattern is also prolonged correspondingly. However, due to the prolongation of the time of cumulative exposure to the thin film, a problem of the light fastness to short-wavelength light such as an ArF excimer laser has been newly actualized this time. In particular, in the case of a phase shift film using a metal silicide, there has arisen a problem that the light fastness is lower than those of other materials.

The present inventors have elucidated that, in the case of a transfer mask having a metal silicide-based thin film, a phenomenon occurs in which the line width changes (increases) due to cumulative irradiation of an ArF excimer laser as an exposure light source beyond the conventional period of time of the repeated use of the mask. The present inventors have examined a pattern of a metal silicide-based thin film (thin film composed mainly of a metal and silicon) in a transfer mask subjected to a change (increase) in line width due to its repeated use. As a result, the present inventors have elucidated that, as shown in FIG. 5, an alterated layer 2' containing Si, O, and a little metal (e.g. Mo) is formed on the surface layer side of a metal silicide-based thin film 2 (e.g. MoSi-based film) and that this is one of main causes of a line width change (increase) Δd and changes in transmittance and phase difference. The fact that the line width changes as the number of times of use of the transfer mask (the number of times of irradiation of an ArF excimer laser using an exposure apparatus) increases means that the in-plane dimensional uniformity of the transfer mask decreases, and therefore, this becomes a serious impeding factor for the increase in the lifetime of the transfer mask.

The reason (mechanism) for the formation of such an alterated layer is considered as follows. That is, the conventional sputtered metal silicide-based thin film (e.g. MoSi-based film) structurally has gaps and, even if annealing is carried out after the film formation, the change in the structure of the metal silicide-based thin film (e.g. MoSi film) is small, and therefore, for example, oxygen ($O_2$), water ($H_2O$), and the like in the atmosphere and, further, ozone ($O_3$) and the like produced by reaction of oxygen ($O_2$) in the atmosphere with an ArF excimer laser enter the gaps and react with Si and Mo forming the metal silicide-based thin film (e.g. MoSi-based film) in the course of using the photomask.

That is, when Si and metal M (e.g. Mo) forming the metal silicide-based thin film (e.g. MoSi-based film) are subjected to irradiation of exposure light (particularly short-wavelength light such as ArF) in such an environment, they are excited into a transition state so that Si is oxidized and expanded (because $SiO_2$ is larger in volume than Si) and metal M (e.g. Mo) is also oxidized, thereby forming the alterated layer on the surface layer side of the metal silicide-based thin film (e.g. MoSi-based film). In this event, the quality of a Si oxide film formed largely differs depending on the amount of water (humidity) in the atmosphere and, as the humidity increases, the Si oxide film with a lower density is formed. In the case where the transfer mask is repeatedly used in the environment where the low-density Si oxide film is formed, while being cumulatively subjected to the irradiation of the exposure light, the oxidation and expansion of Si further proceed and metal M (e.g. Mo) oxidized at the interface between the bulk and the alterated layer diffuses in the alterated layer to be deposited on a surface thereof and sublimated as, for example, an oxide of metal M (e.g. $MoO_3$). Accordingly, the alterated layer is further reduced in density and thus is in a state where it is easily oxidized. As a result, it is considered that the thickness of the alterated layer gradually increases (the occupation ratio of the alterated layer in the metal silicide-based thin film (e.g. MoSi film) increases).

On the other hand, although not comparable with the metal silicide thin film, the light fastness problem possibly arises even in a thin film composed mainly of tantalum, thus hindering the increase in the lifetime of a transfer mask. Even in the case of the thin film composed mainly of the metal such as tantalum, an oxide film of the metal is formed on the surface layer side of the thin film. This is presumably caused by the fact that ozone ($O_3$) and the like produced by reaction with an ArF excimer laser entered gaps of the thin film.

This invention has been made under these circumstances and has an object to provide a mask blank which enables a long lifetime of a mask such that the in-plane dimensional change of a mask pattern is small even if it continues to be irradiated with ArF exposure light and thus that the light fastness to the ArF exposure light is high, and which can improve the productivity.

It is another object of this invention to provide a transfer mask manufactured using the above-mentioned mask blank.

It is still another object of this invention to provide a film denseness evaluation method suitable for evaluating the denseness of a thin film in the above-mentioned mask blank or transfer mask.

Means for Solving the Problem

As a result of continuing intensive studies for solving the above-mentioned problems, the present inventors have paid attention to the fact that, in the case of both a metal silicide thin film and a thin film composed mainly of tantalum, oxidation proceeds due to ozone ($O_3$) and the like entering small structural gaps of the film and to the fact that the formation of an alterated layer is significant in the case of the metal silicide thin film in which the gaps are relatively large structurally while the formation of an alterated layer is small in the case of the tantalum thin film in which the gaps are relatively small structurally, and have found that if a pattern is formed by a light-shielding film which is dense with less pores so as to prevent ozone ($O_3$) and the like from entering the inside of the thin film, the in-plane dimensional change of the transfer pattern can be made small during exposure using an ArF excimer laser.

First, it is considered to use a film density as an index of the denseness of a thin film. The density of the thin film can be obtained by an XRR (X-Ray Reflectivity) method or the like. However, it has been found that, even in the case of the same metal silicide-based materials, the film density lower limit that can provide sufficient light fastness to ArF exposure light changes depending on a film composition and thus the film density lower limit should be specified per film composition, and therefore, that the generality is very low as an index. Taking this into account, as a result of specifying the film density lower limits for various metal silicide materials with various compositions, the present inventors have found that if the film density lower limit value, that can provide light fastness to ArF exposure light, of a thin film having a certain film composition is converted to a relative density which is calculated by dividing the film density lower limit value by a theoretical density of a material of the same composition as the film composition, even in the case of thin films of different film compositions, the lower limit values of relative densities thereof tend to be a predetermined value or greater.

Also in the case of thin films composed mainly of tantalum, although the relative density lower limit values thereof differ from those of the metal silicide-based materials, it has been found that if the film density lower limit values that can provide light fastness to ArF exposure light are converted to relative densities, the lower limit values of the relative values tend to be a predetermined value or greater even when the tantalum-based thin films have different film compositions.

Specifically, this invention has the following structures.
(Structure 1)
A mask blank for use in the manufacture of a transfer mask adapted to be applied with ArF exposure light, the mask blank having a thin film for forming a transfer pattern on a transparent substrate, wherein the thin film is made of a material composed mainly of tantalum (Ta), and when an actual density of the thin film is given by d1 and a theoretical density calculated from a film composition of the thin film is given by d2, a relative density d of the thin film given by d=(d1/d2)×100 is greater than 83%.
(Structure 2)
The mask blank according to Structure 1, wherein the thin film is made of the material comprising the tantalum (Ta) as a main component and one or more elements selected from boron (B), carbon (C), nitrogen (N), and oxygen (O).

(Structure 3)

A mask blank for use in the manufacture of a transfer mask adapted to be applied with ArF exposure light, the mask blank having a thin film for forming a transfer pattern on a transparent substrate, wherein the thin film is made of a material composed mainly of silicon (Si) and a transition metal, and when an actual density of the thin film is given by d1 and a theoretical density calculated from a film composition of the thin film is given by d2, a relative density d of the thin film given by $d=(d1/d2)\times100$ is greater than 94%.

(Structure 4)

The mask blank according to Structure 3, wherein the thin film comprises the silicon (Si) and one or more transition metals selected from titanium (Ti), vanadium (V), niobium (Nb), molybdenum (Mo), zirconium (Zr), ruthenium (Ru), rhodium (Rh), chromium (Cr), nickel (Ni), hafnium (Hf), tantalum (Ta), and tungsten (W).

(Structure 5)

The mask blank according to any one of Structures 1 to 4, wherein the actual density d1 of the thin film is an XRR calculated density calculated by an XRR method.

(Structure 6)

The mask blank according to any one of Structures 1 to 5, wherein the thin film is a light-shielding film adapted to shield the exposure light and the light-shielding film has a structure in which a light-shielding layer and a front-surface antireflection layer are laminated in this order from the transparent substrate side.

(Structure 7)

The mask blank according to Structure 6, wherein the light-shielding film has a back-surface antireflection layer between the transparent substrate and the light-shielding layer.

(Structure 8)

A transfer mask having a transfer pattern formed in the thin film of the mask blank according to any one of Structures 1 to 7.

(Structure 9)

A film denseness evaluation method for evaluating a denseness of a thin film of a mask blank having the thin film on a transparent substrate, which comprises setting an actual density of the thin film to d1, setting a theoretical density calculated from a material composition of the thin film to d2, calculating a relative density d from the actual density d1 and the theoretical density d2 according to $d=(d1/d2)\times100$, and evaluating the denseness of the thin film by the relative density d.

(Structure 10)

The film denseness evaluation method according to Structure 9, wherein the actual density d1 of the thin film is an XRR calculated density calculated by an XRR method.

Effect of the Invention

According to the Structure 1 of this invention, a mask blank having a thin film for forming a transfer pattern, which is made of a material composed mainly of Ta, is such that when an actual density of the thin film is given by d1 and a theoretical density calculated from a film composition of the thin film is given by d2, a relative density d of the thin film given by d (relative density)=$(d1/d2)\times100$ is greater than 83%. As a consequence, the thin film with high denseness can be obtained. By obtaining the thin film with high denseness, alteration of the thin film due to exposure light irradiation can be prevented so that the substantial thickness of the thin film does not change. That is, it is possible to obtain the mask blank which enables a long lifetime such that a change in pattern size caused by oxidation of a surface of the thin film due to irradiation of ArF exposure light is small, and thus it is possible to obtain high reliability as a mask blank.

Further, according to this invention, by providing an evaluation index in the form of a relative density, the denseness can be quantitatively evaluated even for a thin film of a different composition and thus the relationship between the relative density and the mask blank lifetime can be made clear. It is possible to obtain a mask blank with a long lifetime and with high reliability.

In particular, for the mask blank in which, as the Structure 2, the thin film is made of a material comprising tantalum (Ta) as a main component and one or more elements selected from boron (B), carbon (C), nitrogen (N), and oxygen (O), the relationship between the relative density d and the mask blank lifetime is suitably used.

According to the Structure 3 of this invention, a mask blank having a thin film for forming a transfer pattern, which is made of a material composed mainly of silicon (Si) and a transition metal, is such that when an actual density of the thin film is given by d1 and a theoretical density calculated from a film composition of the thin film is given by d2, a relative density d of the thin film given by d (relative density)=$(d1/d2)\times100$ is greater than 94%. As a consequence, alteration of the thin film due to exposure light irradiation can be prevented so that the substantial thickness of the thin film does not change. That is, it is possible to obtain the mask blank which enables a long lifetime such that a change in pattern size caused by oxidation of a surface of the thin film due to irradiation of ArF exposure light is small, and thus it is possible to obtain high reliability as a mask blank.

Also in the invention of the Structure 3, by providing an evaluation index in the form of a relative density, the denseness can be quantitatively evaluated even for a thin film of a different composition and thus the relationship between the relative density and the mask blank lifetime can be made clear. It is possible to obtain a mask blank with a long lifetime and with high reliability.

In particular, for the mask blank in which, as the Structure 4 of this invention, the thin film comprises silicon (Si) and one or more transition metals selected from titanium (Ti), vanadium (V), niobium (Nb), molybdenum (Mo), zirconium (Zr), ruthenium (Ru), rhodium (Rh), chromium (Cr), nickel (Ni), hafnium (Hf), tantalum (Ta), and tungsten (W), the relationship between the relative density d and the mask blank lifetime is suitably used.

Using an XRR density calculated by an XRR method as the actual density d1 of the thin film as the Structure 5, the film density can be calculated with high accuracy even if the thin film is very thin like a thin film of a mask blank, which is thus preferable.

According to the Structure 8 of this invention, the denseness of the thin film can be quantitatively evaluated using the relative density d so that the relationship between the relative density and the mask blank lifetime can be made clear. Using this evaluation method, it is possible to obtain a reliability evaluation index and thus to improve the productivity.

MODE FOR CARRYING OUT THE INVENTION

Examples

Figure 1:
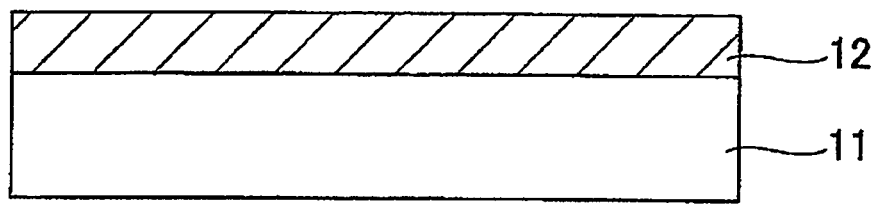
FIG. 1 is a cross-sectional view showing an Example of a mask blank according to this invention.

Mask blanks according to this invention will be described. FIG. 1 is a cross-sectional view showing an Example of a mask blank according to this invention.

The mask blank according to this Example has, as shown in FIG. 1, a thin film 12 for forming a transfer pattern on a transparent substrate 11 and will be used for producing a transfer mask. This mask blank can be obtained by forming, on the transparent substrate 11, the thin film 12 made of, for example, $Ta_xB_y$, $Ta_xN_y$, $Mo_xSi_y$, or $Ta_xSi_y$ by sputtering or the like. The thin film 12 will be subjected to patterning by the photolithography so as to function as a light-shielding film of the transfer mask. As the transparent substrate 11, use was made of a synthetic quartz glass substrate having an about 152 mm×152 mm longitudinal and transverse size with a thickness of 6.35 mm.

Hereinbelow, the relationships between the relative density and the altered layer thickness will be described using Comparative Examples in the case where thin films are $Ta_xB_y$, $Ta_xN_y$, $Mo_xSi_y$, and $Ta_xSi_y$, respectively.

Example 1

In Case of $Ta_xB_y$ Film

First, Examples and a Comparative Example will be described in the case where a thin film is $Ta_xB_y$.

Example 1-1

Using a mixed target of tantalum (Ta) and boron (B) (mixing ratio Ta:B=80 at %:20 at %), reactive sputtering (DC sputtering) was carried out by setting the power of a DC power supply to 1.5 kW in an argon (Ar) gas atmosphere at a gas pressure of 0.062 Pa, thereby forming a $Ta_xB_y$ film made of tantalum and boron and having a thickness of 50 nm on a transparent substrate.

Example 1-2

A $Ta_xB_y$ film is formed on a transparent substrate in the same manner as in the above-mentioned Example 1-1. What differs from the above-mentioned Example 1-1 is that the film was formed by changing the gas pressure in a film forming apparatus. Using a mixed target of tantalum (Ta) and boron (B) (mixing ratio Ta:B=80 at %:20 at %), reactive sputtering (DC sputtering) was carried out by setting the power of a DC power supply to 1.5 kW in an argon (Ar) gas atmosphere at a gas pressure of 0.303 Pa, thereby forming a $Ta_xB_y$ film made of tantalum and boron and having a thickness of 50 nm.

Example 1-3

A $Ta_xB_y$ film is formed on a transparent substrate in the same manner as in the above-mentioned Example 1-1. What differs from the above-mentioned Example 1-1 is that the film was formed by changing the gas pressure in the film forming apparatus. Using a mixed target of tantalum (Ta) and boron (B) (mixing ratio Ta:B=80 at %:20 at %), reactive sputtering (DC sputtering) was carried out by setting the power of a DC power supply to 1.5 kW in an argon (Ar) gas atmosphere at a gas pressure of 0.562 Pa, thereby forming a $Ta_xB_y$ film made of tantalum and boron and having a thickness of 50 nm.

Comparative Example 1

A $Ta_xB_y$ film is formed on a transparent substrate in the same manner as in the above-mentioned Example 1-1. What differs from the above-mentioned Example 1-1 is that the film was formed by changing the gas pressure in the film forming apparatus. Using a mixed target of tantalum (Ta) and boron (B) (mixing ratio Ta:B=80 at %:20 at %), reactive sputtering (DC sputtering) was carried out by setting the power of a DC power supply to 1.5 kW in an argon (Ar) gas atmosphere at a gas pressure of 0.911 Pa, thereby forming a $Ta_xB_y$ film made of tantalum and boron and having a thickness of 50 nm.

Example 1-4

A $Ta_xB_y$ film is formed on a transparent substrate in the same manner as in the above-mentioned Example 1-1. What differs from the above-mentioned Example 1-1 is that the film was formed by changing the kind of sputtering gas. Using a mixed target of tantalum (Ta) and boron (B) (mixing ratio Ta:B=80 at %:20 at %), reactive sputtering (DC sputtering) was carried out by setting the power of a DC power supply to 1.5 kW in a xenon (Xe) gas atmosphere at a gas pressure of 0.060 Pa, thereby forming a $Ta_xB_y$ film made of tantalum and boron and having a thickness of 50 nm.

Example 1-5

A $Ta_xB_y$ film is formed on a transparent substrate in the same manner as in the above-mentioned Example 1-4. What differs from the above-mentioned Example 1-1 is that the film was formed by changing the kind of sputtering gas and the gas pressure in the film forming apparatus. Using a mixed target of tantalum (Ta) and boron (B) (mixing ratio Ta:B=80 at %:20 at %), reactive sputtering (DC sputtering) was carried out by setting the power of a DC power supply to 1.5 kW in a xenon (Xe) gas atmosphere at a gas pressure of 0.193 Pa, thereby forming a $Ta_xB_y$ film made of tantalum and boron and having a thickness of 50 nm.

Then, relative densities d of the Examples 1-1 to 1-5 and the Comparative Example 1 were obtained.

(1) An actual density (g/cm$^3$) of each $Ta_xB_y$ film was calculated using the XRR (X-Ray Reflectivity) method. An X-ray was caused to be incident on a sample surface at very shallow angles and an X-ray intensity profile reflected in specular directions corresponding to the incident angles was measured. Results obtained by this measurement were compared with simulation results to optimize simulation parameters, thereby obtaining an XRR calculated density (actual density) d1.

(2) A theoretical density d2 is calculated from literature values. When a $Ta_xB_y$ film contains more than 33 at % Ta, it is assumed to be a mixture of $TaB_2$ (Ta:B=33:67) and Ta. Conversely, when a $Ta_xB_y$ film contains less than 33 at % Ta, it is assumed to be a mixture of $TaB_2$ (Ta:B=33:67) and B. The literature values used in the calculation are described in Table 1.

Herein, XPS (X-ray Photoelectron Spectroscopy), AES (Atomic Emission Spectrometry), or RBS (Rutherford Backscattering Spectrometry) is used as an analysis method for obtaining an actual composition of the $Ta_xB_y$ film. In any of the cases, it is necessary to make correction using analysis values of XRF (X-ray Fluorescence Spectrometry) or ICP-MS (Inductively Coupled Plasma-Mass Spectrometry). As a material for correction by XRF or ICP-MS, use is made of the stably present alloy composition, $TaB_2$ (Ta:B=33:67), which is used in the calculation of the theoretical density. This also applies to the following Examples. The theoretical density of the $Ta_xB_y$ film was calculated by calculating Ta—$TaB_2$ weight and volume mixing ratios from the composition of the $Ta_xB_y$ film obtained by the above-mentioned analysis and by further using the numerical values of Table 1.

(3) Relative density d=(XRR calculated density d1/theoretical density d2)×100 was obtained. Table 2 shows the XRR calculated densities (actual densities) d1, the theoretical densities d2, and the relative densities d.

TABLE 1

| Mixed Substance | Atomic Weight | Density [g/cm³] |
|---|---|---|
| $TaB_2$ | 202.57 | 11.15 |
| Ta | 180.95 | 16.60 |
| B | 10.81 | 2.34 |

TABLE 2

| Film Material | Film Composition [at %] | | Weight Mixing Ratio [wt %] | | Volume Mixing Ratio [vol %] | | Theoretical Density d2 [g/cm³] | XRR Calculated Density d1 [g/cm³] | Relative Density d [%] |
|---|---|---|---|---|---|---|---|---|---|
| $Ta_xB_y$ | Ta | B | Ta | $TaB_2$ | Ta | $TaB_2$ | | | |
| Example 1-1 | 80 | 20 | 86.2 | 13.8 | 80.8 | 19.2 | 15.55 | 14.85 | 95.5 |
| Example 1-2 | 80 | 20 | 86.2 | 13.8 | 80.8 | 19.2 | 15.55 | 14.78 | 95.1 |
| Example 1-3 | 80 | 20 | 86.2 | 13.8 | 80.8 | 19.2 | 15.55 | 14.44 | 92.9 |
| Example 1-4 | 80 | 20 | 86.2 | 13.8 | 80.8 | 19.2 | 15.55 | 15.22 | 97.8 |
| Example 1-5 | 80 | 20 | 86.2 | 13.8 | 80.8 | 19.2 | 15.55 | 13.77 | 88.5 |
| Comparative Example 1 | 80 | 20 | 86.2 | 13.8 | 80.8 | 19.2 | 15.55 | 12.37 | 79.6 |

Example 2

$Ta_xN_y$ Film

Next, Examples and Comparative Examples will be described in the case where a thin film is $Ta_xN_y$.

Example 2-1

Using a Ta target, reactive sputtering (DC sputtering) was carried out by setting the power of a DC power supply to 1.5 kW in a mixed gas atmosphere of xenon (Xe) and nitrogen ($N_2$) (gas flow rate ratio Xe:$N_2$=71:29) at a gas pressure of 0.076 Pa, thereby forming a $Ta_xN_y$ film having a thickness of 50 nm on a transparent substrate.

Example 2-2

A $Ta_xN_y$ film is formed on a transparent substrate in the same manner as in the above-mentioned Example 2-1. What differs from the above-mentioned Example 2-1 is that the film was formed by changing the flow rate ratio of the xenon gas to the nitrogen gas. Using a Ta target, reactive sputtering (DC sputtering) was carried out by setting the power of a DC power supply to 1.5 kW in a mixed gas atmosphere of xenon (Xe) and nitrogen ($N_2$) (gas flow rate ratio Xe:$N_2$=55:45) at a gas pressure of 0.076 Pa, thereby forming a $Ta_xN_y$ film having a thickness of 50 nm.

Example 2-3

A $Ta_xN_y$ film is formed on a transparent substrate in the same manner as in the above-mentioned Example 2-1. What differs from the above-mentioned Example 2-1 is that the film was formed by changing the flow rate ratio of the xenon gas to the nitrogen gas. Using a Ta target, reactive sputtering (DC sputtering) was carried out by setting the power of a DC power supply to 1.5 kW in a mixed gas atmosphere of xenon (Xe) and nitrogen ($N_2$) (gas flow rate ratio Xe:$N_2$=44:56) at a gas pressure of 0.075 Pa, thereby forming a $Ta_xN_y$ film having a thickness of 50 nm.

Comparative Example 2-1

$Ta_xN_y$ Film

A $Ta_xN_y$ film is formed on a transparent substrate in the same manner as in the above-mentioned Example 2-1. What differs from the above-mentioned Example 2-1 is that the film was formed by changing the flow rate ratio of the xenon gas to the nitrogen gas. Using a Ta target, reactive sputtering (DC sputtering) was carried out by setting the power of a DC power supply to 1.5 kW in a mixed gas atmosphere of xenon (Xe) and nitrogen ($N_2$) (gas flow rate ratio Xe:$N_2$=38:62) at a gas pressure of 0.075 Pa, thereby forming a $Ta_xN_y$ film having a thickness of 50 nm.

Comparative Example 2-2

Ta Film

Being different from the above-mentioned Example 2-1, a Ta film was formed on a transparent substrate using only a noble gas (xenon gas) as a sputtering gas. Using a Ta target, reactive sputtering (DC sputtering) was carried out by setting the power of a DC power supply to 1.5 kW in a xenon (Xe) gas atmosphere at a gas pressure of 0.075 Pa, thereby forming a Ta film having a thickness of 50 nm.

Relative densities d of the above-mentioned Examples 2-1 to 2-3 and Comparative Examples 2-1 and 2-2 were obtained in the same manner as in the above-mentioned Example 1.

(1) An XRR calculated density (actual density) d1 of each $Ta_xN_y$ film was obtained using the XRR (X-Ray Reflectivity) method.

(2) A theoretical density d2 was calculated from literature values. When a $Ta_xN_y$ film contains less than 50 at % Ta, it is assumed to be a mixture of TaN (Ta:N=1:1) and Ta. The literature values used in the calculation are described in Table 3.

The theoretical density of the $Ta_xN_y$ film was calculated by calculating Ta—TaN weight and volume mixing ratios from the composition of the $Ta_xN_y$ film obtained by an analysis in the same manner as in the Example 1 and by further using the numerical values of Table 3.

(3) Relative density d=(XRR calculated density d1/theoretical density d2)×100 was obtained. Table 4 shows calculation results thereof.

TABLE 3

| Mixed Substance | Atomic Weight | Density [g/cm³] |
|---|---|---|
| TaN | 194.96 | 16.30 |
| Ta | 180.95 | 16.60 |

TABLE 4

| Film Material | Film Composition [at %] | | Weight Mixing Ratio [wt %] | | Volume Mixing Ratio [vol %] | | Theoretical Density d2 [g/cm³] | XRR Calculated Density d1 [g/cm³] | Relative Density d [%] |
|---|---|---|---|---|---|---|---|---|---|
| $Ta_xN_y$ | Ta | N | Ta | TaN | Ta | TaN | | | |
| Example 2-1 | 85 | 15 | 81.3 | 18.7 | 81.0 | 19.0 | 16.54 | 15.56 | 94.0 |
| Example 2-2 | 77 | 23 | 68.1 | 31.9 | 67.7 | 32.3 | 16.50 | 14.77 | 89.5 |
| Example 2-3 | 70 | 30 | 55.3 | 44.7 | 54.8 | 45.2 | 16.46 | 13.78 | 83.7 |
| Comparative Example 2-1 | 63 | 37 | 39.5 | 60.5 | 39.1 | 60.9 | 16.42 | 13.38 | 81.5 |
| Comparative Example 2-2 | 100 | 0 | 100 | 0 | 100 | 0 | 16.60 | 12.38 | 71.6 |

Example 3

$Mo_xSi_y$ Film

Next, Examples and a Comparative Example will be respectively described in the case where a thin film is a $Mo_xSi_y$ film.

Example 3-1

Using a mixed target of molybdenum (Mo) and silicon (Si) (mixing ratio Mo:Si=21.3 at %:78.7 at %), reactive sputtering (DC sputtering) was carried out by setting the power of a DC power supply to 2.0 kW in an argon (Ar) gas atmosphere at a gas pressure of 0.206 Pa, thereby forming a $Mo_xSi_y$ film made of molybdenum and silicon and having a thickness of 50 nm on a transparent substrate.

Example 3-2

Being different from the above-mentioned Example 3-1, a $Mo_xSi_y$ film was formed on a transparent substrate using a mixed gas of argon (Ar) and methane ($CH_4$) as a sputtering gas. Reactive sputtering (DC sputtering) was carried out by setting the power of a DC power supply to 2.0 kW in a mixed gas atmosphere of argon (Ar) and methane ($CH_4$) (gas flow rate ratio Ar:$CH_4$=92:8) at a gas pressure of 0.203 Pa, thereby forming a $Mo_xSi_y$ film made of molybdenum and silicon and having a thickness of 50 nm.

Comparative Example 3

$Mo_xSi_y$ Film

A $Mo_xSi_y$ film is formed on a transparent substrate in the same manner as in the above-mentioned Example 3-1. What differs from the above-mentioned Example 3-1 is that the film was formed by changing the gas pressure in a film forming apparatus. Reactive sputtering (DC sputtering) was carried out by setting the power of a DC power supply to 2.0 kW in an argon (Ar) gas atmosphere at a gas pressure of 0.484 Pa, thereby forming a $Mo_xSi_y$ film made of molybdenum and silicon and having a thickness of 50 nm.

Example 3-3

A $Mo_xSi_y$ film is formed on a transparent substrate in the same manner as in the Example 3-1. What differs from the Example 3-1 is that the film was formed by changing a sputtering target used. Using a mixed target of molybdenum (Mo) and silicon (Si) (mixing ratio Mo:Si=33 at %:67 at %), reactive sputtering (DC sputtering) was carried out by setting the power of a DC power supply to 2.0 kW in an argon (Ar) gas atmosphere at a gas pressure of 0.206 Pa, thereby forming a $Mo_xSi_y$ film made of molybdenum and silicon and having a thickness of 50 nm.

Example 3-4

A $Mo_xSi_y$ film is formed on a transparent substrate in the same manner as in the Example 3-1. What differs from the Example 3-1 is that the film was formed by changing a sputtering target used. Using a mixed target of molybdenum (Mo) and silicon (Si) (mixing ratio Mo:Si=4 at %:96 at %), reactive sputtering (DC sputtering) was carried out by setting the power of a DC power supply to 2.0 kW in an argon (Ar) gas atmosphere at a gas pressure of 0.206 Pa, thereby forming a $Mo_xSi_y$ film made of molybdenum and silicon and having a thickness of 50 nm.

Then, relative densities d of the above-mentioned Examples 3-1 to 3-4 and Comparative Example 3 were obtained.

(1) An XRR calculated density (actual density) d1 of each $Mo_xSi_y$ film was obtained using the XRR method.

(2) A theoretical density d2 was calculated from literature values. In the case of not more than 33 at % Mo, a $Mo_xSi_y$ film is assumed to be a mixture of $MoSi_2$ (Mo:Si=33:67) and Si. Conversely, when a $Mo_xSi_y$ film contains more than 33 at % Mo, it is assumed to be a mixture of $MoSi_2$ and Mo. The literature values used in the calculation are described in Table 5. The theoretical density of the $Mo_xSi_y$ film was calculated by calculating $MoSi_2$—Si weight and volume mixing ratios from the composition of the $Mo_xSi_y$ film obtained by an analysis in the same manner as in the Example 1 and by further using the numerical values of Table 5.

(3) Relative density d=(XRR calculated density d1/theoretical density d2)×100 was obtained. Table 6 shows calculation results thereof.

TABLE 5

| Mixed Substance | Atomic Weight | Density [g/cm³] |
|---|---|---|
| MoSi$_2$ | 152.13 | 6.31 |
| Si | 28.09 | 2.33 |
| Mo | 95.95 | 10.28 |

TABLE 6

| Film Material | Film Composition [at %] | | Weight Mixing Ratio [wt %] | | Volume Mixing Ratio [vol %] | | Theoretical Density d2 [g/cm³] | XRR Calculated Density d1 [g/cm³] | Relative Density d [%] |
|---|---|---|---|---|---|---|---|---|---|
| Mo$_x$Si$_y$ | Mo | Si | MoSi$_2$ | Si | MoSi$_2$ | Si | | | |
| Example 3-1 | 21.3 | 78.7 | 88.6 | 11.4 | 74.2 | 25.8 | 5.28 | 5.11 | 96.7 |
| Example 3-2 | 21.3 | 78.7 | 88.6 | 11.4 | 74.2 | 25.8 | 5.28 | 5.16 | 97.6 |
| Example 3-3 | 33 | 67 | 100 | 0 | 100 | 0 | 6.31 | 5.96 | 94.5 |
| Example 3-4 | 4 | 96 | 20.5 | 79.5 | 8.7 | 91.3 | 2.68 | 2.60 | 97.0 |
| Comparative Example 3 | 21.3 | 78.7 | 88.6 | 11.4 | 74.2 | 25.8 | 5.28 | 4.91 | 93.0 |

Example 4

Ta$_x$Si$_y$ Film

Next, an Example and a Comparative Example will be respectively described in the case where a thin film is a Ta$_x$Si$_y$ film.

Example 4-1

Using a mixed target of tantalum (Ta) and silicon (Si) (mixing ratio Ta:Si=33 at %:67 at %), reactive sputtering (DC sputtering) was carried out by setting the power of a DC power supply to 1.5 kW in an argon (Ar) gas atmosphere at a gas pressure of 0.206 Pa, thereby forming a Ta$_x$Si$_y$ film made of tantalum and silicon and having a thickness of 50 nm on a transparent substrate.

Comparative Example 4

A Ta$_x$Si$_y$ film is formed on a transparent substrate in the same manner as in the Example 4-1. What differs from the above-mentioned Example 4-1 is that the film was formed by changing the gas pressure in a film forming apparatus. Using a mixed target of tantalum (Ta) and silicon (Si) (mixing ratio Ta:Si=33 at %:67 at %), reactive sputtering (DC sputtering) was carried out by setting the power of a DC power supply to 1.5 kW in an argon (Ar) gas atmosphere at a gas pressure of 0.484 Pa, thereby forming a TaSi film made of tantalum and silicon and having a thickness of 50 nm.

Then, relative densities d of the Example 4-1 and the Comparative Example 4 were obtained.

(1) An XRR calculated density (actual density) d1 of each Ta$_x$Si$_y$ film was obtained using the XRR method.

(2) A theoretical density d2 was calculated from literature values. In the case of not more than 33 at % Ta, a Ta$_x$Si$_y$ film is assumed to be a mixture of TaSi (Ta:Si=33:67) and Si. Conversely, when a Ta$_x$Si$_y$ film contains more than 33 at % Ta, it is assumed to be a mixture of TaSi$_2$ and Ta. The literature values used in the calculation are described in Table 7.

The theoretical density of the Ta$_x$Si$_y$ film was calculated by calculating TaSi$_2$—Si weight and volume mixing ratios from the composition of the Ta$_x$Si$_y$ film obtained by an analysis in the same manner as in the Example 1 and by further using the numerical values of Table 7.

(3) Relative density d=(XRR calculated density d1/theoretical density d2)×100 was obtained. Table 8 shows calculation results thereof

TABLE 7

| Mixed Substance | Atomic Weight | Density [g/cm³] |
|---|---|---|
| TaSi$_2$ | 237.11 | 9.14 |
| Si | 28.09 | 2.33 |
| Ta | 180.95 | 16.60 |

TABLE 8

| Film Material | Film Composition [at %] | | Weight Mixing Ratio [wt %] | | Volume Mixing Ratio [vol %] | | Theoretical Density d2 [g/cm³] | XRR Calculated Density d1 [g/cm³] | Relative Density d [%] |
|---|---|---|---|---|---|---|---|---|---|
| Ta$_x$Si$_y$ | Ta | Si | TaSi$_2$ | Si | TaSi$_2$ | Si | | | |
| Example 4-1 | 33 | 67 | 100 | 0 | 100 | 0 | 9.14 | 8.73 | 95.5 |
| Comparative Example 4 | 33 | 67 | 100 | 0 | 100 | 0 | 9.14 | 8.41 | 92.0 |

(Light-Shielding Film Denseness Evaluation)

An ArF excimer laser was continuously irradiated on each of the mask blanks produced in the above-mentioned Examples and Comparative Examples so that the total dose became 30 kJ/cm². Then, the thickness of an altered layer at a surface of each thin film after the irradiation was measured. The dose of 30 kJ/cm² (energy density is about 25 mJ/cm²)

corresponds to exposure to resists of 100,000 wafers using a transfer mask and corresponds to the use for approximately three months with a normal frequency of use of a photomask.

Herein, the ArF excimer laser was irradiated on the thin film, then a cross section of the thin film was observed using a TEM (transmission electron microscope), and the thickness of the altered layer at the surface of the thin film was regarded as a change in pattern size due to ArF excimer laser irradiation. The reason for this will be given below. Since the surface alteration is mainly caused by oxidation, it entails an increase in film thickness and a reduction in the light-shielding performance of the altered layer portion. The increase in the thickness of the thin film corresponds to a change in pattern size at a pattern side wall and the reduction in light-shielding performance is regarded as a substantial change in pattern size during exposure. Therefore, the thickness of the altered layer is considered to be equivalent to a change in pattern size that affects the exposure.

When the thickness of the altered layer is 2.0 nm or less, it can be said that the dimensional uniformity of a mask satisfies a requirement of 2.4 nm or less in the photolithography of less than 45 nm half-pitch. Table 9 shows the relative densities and the altered layer thicknesses in the respective Examples and Comparative Examples.

Ta film (Comparative Example 2-2), when the relative density was as low as 71.6%, the thickness of the altered layer was 2.5 nm.

(Evaluation: $Mo_xSi_y$ Film)

In the case of the $Mo_xSi_y$ film, when the relative density d was 93.0%, the thickness of the altered layer was 6.0 nm in the Comparative Example 3. On the other hand, even when the relative density d was 94.5% which was the lowest in the Examples 3-1 to 3-4, the thickness of the altered layer was 2.0 nm. As is clear from the results of the Examples 3-1 to 3-4, the thickness of the altered layer largely depends on the relative density d rather than the film composition.

(Evaluation: $Ta_xSi_y$ Film)

In the case of the $Ta_xSi_y$ film, when the relative density d was 92.0%, the thickness of the altered layer was 3.5 nm in the Comparative Example 4, while, as shown in the Example 4-1, when the relative density was 95.5%, the thickness of the altered layer was 1.5 nm. As is also clear from a comparison with the Examples 3-1 to 3-4, it is seen that, in the case of the thin film containing silicon, the thickness of the altered layer largely depends on the relative density d rather than the kind of contained transition metal.

From the above-mentioned results, in the case of the thin film made of TaB or TaN composed mainly of tantalum (Ta),

TABLE 9

| | | Film Composition [at %] | | | | | Relative Density [%] | Altered Layer Thickness [nm] |
|---|---|---|---|---|---|---|---|---|
| | Film Material | Ta | B | N | Mo | Si | | |
| Example 1-1 | $Ta_xB_y$ | 80 | 20 | 0 | 0 | 0 | 95.5 | 0.5 |
| Example 1-2 | $Ta_xB_y$ | 80 | 20 | 0 | 0 | 0 | 95.1 | 0.5 |
| Example 1-3 | $Ta_xB_y$ | 80 | 20 | 0 | 0 | 0 | 92.9 | 1.0 |
| Example 1-4 | $Ta_xB_y$ | 80 | 20 | 0 | 0 | 0 | 97.8 | 0.5 |
| Example 1-5 | $Ta_xB_y$ | 80 | 20 | 0 | 0 | 0 | 88.5 | 2.0 |
| Comparative Example 1 | $Ta_xB_y$ | 80 | 20 | 0 | 0 | 0 | 79.6 | 3.0 |
| Example 2-1 | $Ta_xN_y$ | 85 | 0 | 15 | 0 | 0 | 94.0 | 0.5 |
| Example 2-2 | $Ta_xN_y$ | 77 | 0 | 23 | 0 | 0 | 89.5 | 1.0 |
| Example 2-3 | $Ta_xN_y$ | 70 | 0 | 30 | 0 | 0 | 83.7 | 2.0 |
| Comparative Example 2-1 | $Ta_xN_y$ | 63 | 0 | 37 | 0 | 0 | 81.5 | 2.5 |
| Comparattive Example 2-2 | $Ta_xN_y$ | 100 | 0 | 0 | 0 | 0 | 71.6 | 2.5 |
| Example 3-1 | $Mo_xSi_y$ | 0 | 0 | 0 | 21.3 | 78.7 | 96.7 | 1.5 |
| Example 3-2 | $Mo_xSi_y$ | 0 | 0 | 0 | 21.3 | 78.7 | 97.6 | 1.0 |
| Example 3-3 | $Mo_xSi_y$ | 0 | 0 | 0 | 33 | 67 | 94.5 | 2.0 |
| Example 3-4 | $Mo_xSi_y$ | 0 | 0 | 0 | 4 | 96 | 97.0 | 1.0 |
| Comparative Example 3 | $Mo_xSi_y$ | 0 | 0 | 0 | 21.3 | 78.7 | 93.0 | 6.0 |
| Example 4-1 | $Ta_xSi_y$ | 33 | 0 | 0 | 0 | 67 | 95.5 | 1.5 |
| Comparative Example 4 | $Ta_xSi_y$ | 33 | 0 | 0 | 0 | 67 | 92.0 | 3.5 |

(Evaluation: $Ta_xB_y$ Film)

In the case of the $Ta_xB_y$ film composed mainly of tantalum, when the relative density d was 79.6%, the thickness of the altered layer was 3.0 nm in the Comparative Example 1 while, even when the relative density d was 88.5% (Example 1-5) which was the lowest among the results of the Examples 1-1 to 1-5, the thickness of the altered layer was 2.0 nm.

(Evaluation: $Ta_xN_y$ Film)

In the case of the $Ta_xN_y$ film, when the relative density d was 81.5%, the thickness of the altered layer was 2.5 nm in the Comparative Example 2-1 while, even when the relative density d was 83.7% which was the lowest among the results of the Examples 2-1 to 2-3, the thickness of the altered layer was 2.0 nm. It is seen that, even in the case of the non-nitrided the thickness of the altered layer can be made not more than 2.0 nm by setting the relative density to greater than 83% (more preferably 84% or more). That is, it is seen that such a thin film has durability to exposure light irradiation using an ArF excimer laser which is widely used currently. As a consequence, it is possible to obtain a longer lifetime and thus to obtain high reliability.

On the other hand, in the case of the thin film made of MoSi or TaSi, the thickness of the altered layer can be made not more than 2.0 nm by setting the relative density to greater than 94% (more preferably 95% or more). That is, it is seen that such a thin film also has durability to exposure light irradiation using an ArF excimer laser.

In the above-mentioned Examples, the description has been given of the case where the thin film composed mainly of tantalum (Ta) is TaB or TaN, but not limited thereto. A thin film may be made of a binary material comprising tantalum (Ta) as a main component and one element selected from boron (B), carbon (C), nitrogen (N), and oxygen (O). Since this thin film can similarly obtain high film denseness in the case where the relative density is greater than 83% (more preferably 84% or more), it has light fastness to exposure light so that the dimensional change of a mask can be made small. For example, in the case where the thin film is a $Ta_xO_y$ film, the theoretical density is preferably calculated by the same technique as in the Example 1 by assuming it to be a mixture of Ta and $Ta_2O_5$ and using respective literature values thereof. For example, in the case where the thin film is a $Ta_xC_y$ film, the theoretical density is preferably calculated by the same technique as in the Example 1 by assuming it to be a mixture of TaC and Ta or C and using respective literature values thereof.

Alternatively, a thin film may be made of a ternary or higher material comprising tantalum (Ta) as a main component and two or more elements selected from boron (B), carbon (C), nitrogen (N), and oxygen (O). The same effect can be obtained. As a method for calculating a theoretical density d2 in this event, for example, in the case where the thin film is a $Ta_xO_yN_z$ film, the theoretical density is preferably calculated by the same technique as in the Example 1 by assuming it to be a mixture of two or more selected from Ta, TaN, and $Ta_2O_5$ and using respective literature values thereof. For example, in the case where the thin film is a $Ta_xB_yN_z$ film, the theoretical density is preferably calculated by the same technique as in the Example 1 by assuming it to be a mixture of two or more selected from Ta, B, $TaB_2$, and TaN and using respective literature values thereof.

For example, in the case where the thin film is a $Ta_xC_yN_z$ film, the theoretical density is preferably calculated by the same technique as in the Example 1 by assuming it to be a mixture of two or more selected from Ta, C, TaC, and TaN and using respective literature values thereof. For example, in the case where the thin film is a $Ta_xB_yO_z$ film, the theoretical density is preferably calculated by the same technique as in the Example 1 by assuming it to be a mixture of two or more selected from Ta, B, $TaB_2$, and $Ta_2O_5$ and using respective literature values thereof. For example, in the case where the thin film is a $Ta_xC_yO_z$ film, the theoretical density is preferably calculated by the same technique as in the Example 1 by assuming it to be a mixture of two or more selected from Ta, C, TaC, and $Ta_2O_5$ and using respective literature values thereof.

For example, in the case where the thin film is a $Ta_wC_xO_yN_z$ film, the theoretical density is preferably calculated by the same technique as in the Example 1 by assuming it to be a mixture of three or more selected from Ta, C, TaC, $Ta_2O_5$, and TaN and using respective literature values thereof. For example, in the case where the thin film is a $Ta_wB_xO_yN_z$ film, the theoretical density is preferably calculated by the same technique as in the Example 1 by assuming it to be a mixture of three or more selected from Ta, B, $TaB_2$, $Ta_2O_5$, and TaN and using respective literature values thereof.

MoSi and TaSi have been described each as the thin film made of the material containing the transition metal. Alternatively, a thin film may be made of a binary material comprising silicon (Si) and one transition metal selected from titanium (Ti), vanadium (V), niobium (Nb), zirconium (Zr), ruthenium (Ru), rhodium (Rh), chromium (Cr), nickel (Ni), hafnium (Hf), and tungsten (W). Since this thin film can similarly obtain high film denseness in the case where the relative density is greater than 94% (more preferably 95% or more), it has light fastness to exposure light so that the dimensional change of a mask can be made small. As a method for calculating a theoretical density d2 in this event, for example, in the case where the thin film is a $Zr_xSi_y$ film, the theoretical density is preferably calculated by the same technique by assuming it to be a mixture of two or more selected from Zr, Si, and $ZrSi_2$ and using respective literature values thereof. For example, in the case where the thin film is a $W_xSi_y$ film, the theoretical density is preferably calculated by the same technique by assuming it to be a mixture of two or more selected from W, Si, and $WSi_2$ and using respective literature values thereof. For example, in the case where the thin film is a $Ti_xSi_y$ film, the theoretical density is preferably calculated by the same technique as in the Example 1 by assuming it to be a mixture of two or more selected from Ti, Si, and $TiSi_2$ and using respective literature values thereof.

For example, in the case where the thin film is a $Cr_xSi_y$ film, the theoretical density is preferably calculated by the same technique by assuming it to be a mixture of two or more selected from Cr, Si, and $CrSi_2$ and using respective literature values thereof. For example, in the case where the thin film is a $Nb_xSi_y$ film, the theoretical density is preferably calculated by the same technique by assuming it to be a mixture of two or more selected from Nb, Si, and $NbSi_2$ and using respective literature values thereof. For example, in the case where the thin film is a $Hf_xSi_y$ film, the theoretical density is preferably calculated by the same technique as in the Example 1 by assuming it to be a mixture of two or more selected from Hf, Si, and $HfSi_2$ and using respective literature values thereof.

For example, in the case where the thin film is a $V_xSi_y$ film, the theoretical density is preferably calculated by the same technique by assuming it to be a mixture of two or more selected from V, Si, and $VSi_2$ and using respective literature values thereof. For example, in the case where the thin film is a $Ru_xSi_y$ film, the theoretical density is preferably calculated by the same technique by assuming it to be a mixture of two or more selected from Ru, Si, and $RuSi_2$ and using respective literature values thereof. For example, in the case where the thin film is a $Ni_xSi_y$ film, the theoretical density is preferably calculated by the same technique as in the Example 1 by assuming it to be a mixture of two or more selected from Ni, Si, and $NiSi_2$ and using respective literature values thereof.

Alternatively, a thin film may be made of silicon (Si) and two or more transition metals selected from titanium (Ti), vanadium (V), niobium (Nb), zirconium (Zr), ruthenium (Ru), rhodium (Rh), chromium (Cr), nickel (Ni), hafnium (Hf), molybdenum (Mo), tantalum (Ta), and tungsten (W). The same effect can be obtained. In this case, the theoretical density is preferably calculated by the same technique as in the Example 1 by making a selection from the transition metal silicides listed above and making an assumption and by using respective literature values.

Further, as a thin film made of a material containing a transition metal/metals, it may be made of a ternary or higher material comprising silicon (Si), one or more transition metals selected from titanium (Ti), vanadium (V), niobium (Nb), zirconium (Zr), ruthenium (Ru), rhodium (Rh), chromium (Cr), nickel (Ni), hafnium (Hf), and tungsten (W), and further, one or more elements selected from carbon (C), nitrogen (N), and oxygen (O). In this case, the same effect can be obtained. As a method for calculating a theoretical density d2 in this event, for example, in the case where the thin film is a $Mo_xSi_yO_z$ film, the theoretical density is preferably calculated by the same technique by assuming it to be a mixture of those selected from Mo, Si, $MoSi_2$, $MoO_3$, and $SiO_2$ and using respective literature values thereof. For example, in the case where the thin film is a $Mo_xSi_yN_z$ film, the theoretical density is preferably calculated by the same technique by assuming it to be a mixture of those selected from Mo, Si, $MoSi_2$, MoN, and $Si_3N_4$ and using respective literature values thereof. For example, in the case where the thin film is a $Mo_wSi_xO_yN_z$ film, the theoretical density is preferably calculated by the same technique by assuming it to be a mixture of those selected from Mo, Si, $MoSi_2$, MoN, $Si_3N_4$, $MoO_3$, and $SiO_2$ and using respective literature values thereof.

For example, in the case where the thin film is a $Mo_xSi_yC_z$ film, the theoretical density is preferably calculated by the same technique by assuming it to be a mixture of those selected from Mo, Si, C, $MoSi_2$, $Mo_2C$, and SiC and using respective literature values thereof. For example, in the case where the thin film is a $Mo_wSi_xC_yN_z$ film, the theoretical density is preferably calculated by the same technique by assuming it to be a mixture of those selected from Mo, Si, C, $MoSi_2$, MoN, $Si_3N_4$, $Mo_2C$, and SiC and using respective literature values thereof. For example, in the case where the thin film is a $Mo_vSi_wO_xC_yN_z$ film, the theoretical density is preferably calculated by the same technique by assuming it to be a mixture of those selected from Mo, Si, C, $MoSi_2$, $MoO_3$, $SiO_2$, MoN, $Si_3N_4$, $Mo_2C$, and SiC and using respective literature values thereof.

Further, for example, in the case where the thin film is a $Zr_xSi_yO_z$ film, the theoretical density is preferably calculated by the same technique by assuming it to be a mixture of those selected from Zr, Si, $ZrSi_2$, $ZrO_2$, and $SiO_2$ and using respective literature values thereof. For example, in the case where the thin film is a $Zr_xSi_yN_z$ film, the theoretical density is preferably calculated by the same technique by assuming it to be a mixture of those selected from Zr, Si, $ZrSi_2$, ZrN, and $Si_3N_4$ and using respective literature values thereof. For example, in the case where the thin film is a $Zr_wSi_xO_yN_z$ film, the theoretical density is preferably calculated by the same technique by assuming it to be a mixture of those selected from Zr, Si, $ZrSi_2$, ZrN, $Si_3N_4$, $ZrO_2$, and $SiO_2$ and using respective literature values thereof.

For example, in the case where the thin film is a $Zr_xSi_yC_z$ film, the theoretical density is preferably calculated by the same technique by assuming it to be a mixture of those selected from Zr, Si, C, $ZrSi_2$, ZrC, and SiC and using respective literature values thereof. For example, in the case where the thin film is a $Zr_wSi_xC_yN_z$ film, the theoretical density is preferably calculated by the same technique by assuming it to be a mixture of those selected from Zr, Si, C, $ZrSi_2$, ZrN, $Si_3N_4$, ZrC, and SiC and using respective literature values thereof. For example, in the case where the thin film is a $Zr_vSi_wO_xC_yN_z$ film, the theoretical density is preferably calculated by the same technique by assuming it to be a mixture of those selected from Zr, Si, C, $ZrSi_2$, $ZrO_2$, $SiO_2$, ZrN, $Si_3N_4$, ZrC, and SiC and using respective literature values thereof.

Further, for example, in the case where the thin film is a $W_xSi_yO_z$ film, the theoretical density is preferably calculated by the same technique by assuming it to be a mixture of those selected from W, Si, $WSi_2$, $WO_3$, and $SiO_2$ and using respective literature values thereof. For example, in the case where the thin film is a $W_xSi_yN_z$ film, the theoretical density is preferably calculated by the same technique by assuming it to be a mixture of those selected from W, Si, $WSi_2$, WN, and $Si_3N_4$ and using respective literature values thereof. For example, in the case where the thin film is a $W_wSi_xO_yN_z$ film, the theoretical density is preferably calculated by the same technique by assuming it to be a mixture of those selected from W, Si, $WSi_2$, WN, $Si_3N_4$, $WO_3$, and $SiO_2$ and using respective literature values thereof.

For example, in the case where the thin film is a $W_xSi_yC_z$ film, the theoretical density is preferably calculated by the same technique by assuming it to be a mixture of those selected from W, Si, C, $WSi_2$, $W_2C$, and SiC and using respective literature values thereof. For example, in the case where the thin film is a $W_wSi_xC_yN_z$ film, the theoretical density is preferably calculated by the same technique by assuming it to be a mixture of those selected from W, Si, C, $WSi_2$, WN, $Si_3N_4$, $W_2C$, and SiC and using respective literature values thereof. For example, in the case where the thin film is a $W_vSi_wO_xC_yN_z$ film, the theoretical density is preferably calculated by the same technique by assuming it to be a mixture of those selected from W, Si, C, $WSi_2$, $WO_3$, $SiO_2$, WN, $Si_3N_4$, $W_2C$, and SiC and using respective literature values thereof.

Further, for example, in the case where the thin film is a $Ti_xSi_yO_z$ film, the theoretical density is preferably calculated by the same technique by assuming it to be a mixture of those selected from Ti, Si, $TiSi_2$, $TiO_2$, and $SiO_2$ and using respective literature values thereof. For example, in the case where the thin film is a $Ti_xSi_yN_z$ film, the theoretical density is preferably calculated by the same technique by assuming it to be a mixture of those selected from Ti, Si, $TiSi_2$, TiN, and $Si_3N_4$ and using respective literature values thereof. For example, in the case where the thin film is a $Ti_wSi_xO_yN_z$ film, the theoretical density is preferably calculated by the same technique by assuming it to be a mixture of those selected from Ti, Si, $TiSi_2$, TiN, $Si_3N_4$, $TiO_2$, and $SiO_2$ and using respective literature values thereof.

For example, in the case where the thin film is a $Ti_xSi_yC_z$ film, the theoretical density is preferably calculated by the same technique by assuming it to be a mixture of those selected from Ti, Si, C, $TiSi_2$, TiC, and SiC and using respective literature values thereof. For example, in the case where the thin film is a $Ti_wSi_xC_yN_z$ film, the theoretical density is preferably calculated by the same technique by assuming it to be a mixture of those selected from Ti, Si, C, $TiSi_2$, TiN, $Si_3N_4$, TiC, and SiC and using respective literature values thereof. For example, in the case where the thin film is a $Ti_vSi_wO_xC_yN_z$ film, the theoretical density is preferably calculated by the same technique by assuming it to be a mixture of those selected from Ti, Si, C, $TiSi_2$, $TiO_2$, $SiO_2$, TiN, $Si_3N_4$, TiC, and SiC and using respective literature values thereof.

Further, for example, in the case where the thin film is a $Hf_xSi_yO_z$ film, the theoretical density is preferably calculated by the same technique by assuming it to be a mixture of those selected from Hf, Si, $HfSi_2$, $HfO_2$, and $SiO_2$ and using respective literature values thereof. For example, in the case where the thin film is a $Hf_xSi_yN_z$ film, the theoretical density is preferably calculated by the same technique by assuming it to be a mixture of those selected from Hf, Si, $HfSi_2$, HfN, and $Si_3N_4$ and using respective literature values thereof. For example, in the case where the thin film is a $Hf_wSi_xO_yN_z$ film, the theoretical density is preferably calculated by the same technique by assuming it to be a mixture of those selected from Hf, Si, $HfSi_2$, HfN, $Si_3N_4$, $HfO_2$, and $SiO_2$ and using respective literature values thereof.

For example, in the case where the thin film is a $Hf_xSi_yC_z$ film, the theoretical density is preferably calculated by the same technique by assuming it to be a mixture of those selected from Hf, Si, C, $HfSi_2$, HfC, and SiC and using respective literature values thereof. For example, in the case where the thin film is a $Hf_wSi_xC_yN_z$ film, the theoretical density is preferably calculated by the same technique by assuming it to be a mixture of those selected from Hf, Si, C, $HfSi_2$, HfN, $Si_3N_4$, HfC, and SiC and using respective literature values thereof. For example, in the case where the thin film is a $Hf_vSi_wO_xC_yN_z$ film, the theoretical density is preferably calculated by the same technique by assuming it to be a mixture of those selected from Hf, Si, C, HfSi$_2$, HfO$_2$, SiO$_2$, HfN, Si$_3$N$_4$, HfC, and SiC and using respective literature values thereof.

When forming the thin film by sputtering, hydrogen (H) and a noble gas such as helium (He), argon (Ar), or Xe (xenon) may possibly be incorporated into the thin film. Since the amount of these elements contained in the film is basically small, even if the relative density is calculated without regard for these elements, it can be used without any problem as an index of the light fastness to short-wavelength light such as an ArF excimer laser. With respect also to other elements, other than the metal component, contained in the thin film, if the content thereof in the thin film is small (e.g. less than 5 at %), even if the relative density is calculated without regard for these elements, it can be used without any problem as an index of the light fastness to short-wavelength light such as an ArF excimer laser.

Figure 2:
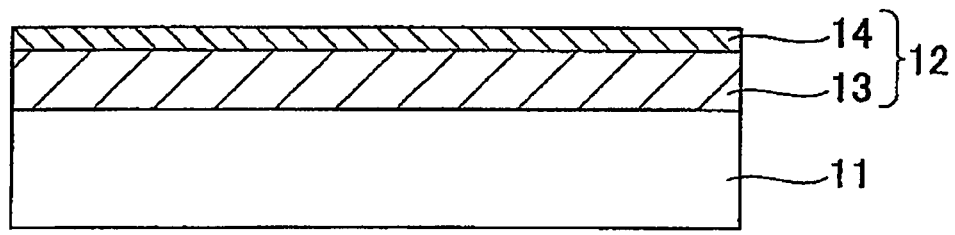
FIG. 2 is a cross-sectional view showing an Example of a mask blank according to this invention having a front-surface antireflection layer.

In the above-mentioned Examples, the description has been given of the mask blanks each having only the light-shielding film on the transparent substrate. However, as shown in FIG. 2, a light-shielding film 12 may have a structure in which a light-shielding layer 13 and a front-surface antireflection layer 14 are laminated in this order from the transparent substrate side 11.

Figure 3:
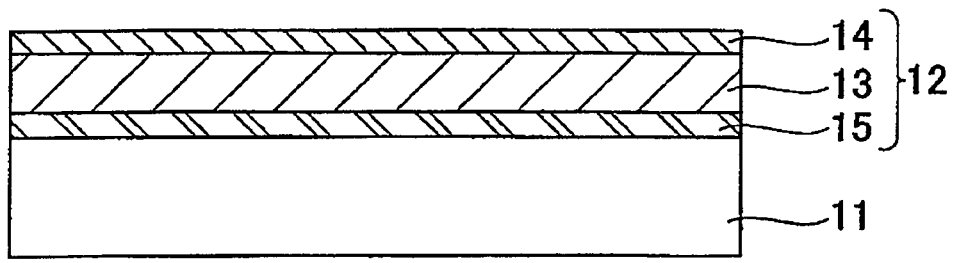
FIG. 3 is a cross-sectional view showing an Example of a mask blank according to this invention having a front-surface antireflection layer and a back-surface antireflection layer.

Further, as shown in FIG. 3, a light-shielding film 12 may have a three-layer laminated structure in which a back-surface antireflection layer 15 is provided between a transparent substrate 11 and a light-shielding layer 13.

In the above-mentioned Examples, the description has been given of the case where TaB, TaN, MoSi, and TaSi having the light-shielding properties were used as the thin films, respectively. However, a semi-transmissive material (oxide, nitride, oxynitride, carboxide, carbonitride, carboxynitride, or the like of metal silicide such as MoSi or TaSi) may be used as a thin film to produce a halftone phase shift mask, an enhancer mask, or a mask blank for producing such a mask, to which this invention is suitably applied.

(Manufacture of Ta-based Light-Shielding Film Mask Blank)

Next, a description will be given of a binary mask blank having a light-shielding film formed of materials composed mainly of Ta, wherein the light-shielding film has a structure with the properties such that the front-surface reflectance and the back-surface reflectance for ArF exposure light are not greater than predetermined values.

As shown in FIG. 2, this light-shielding film is a light-shielding film 12 having a structure in which a light-shielding layer 13 and a front-surface antireflection layer 14 are laminated in this order from the transparent substrate 11 side, wherein the light-shielding layer 13 is formed of Ta$_x$N$_y$, while the front-surface antireflection layer 14 is formed of Ta$_a$O$_b$. A method of manufacturing the light-shielding film 12 will be shown hereinbelow.

Using a Ta target, reactive sputtering (DC sputtering) was carried out by setting the power of a DC power supply to 1.5 kW in a mixed gas atmosphere of xenon (Xe) and nitrogen (N$_2$) (gas flow rate ratio Xe:N$_2$=44:56) at a gas pressure of 0.075 Pa, thereby forming the light-shielding layer (Ta$_x$N$_y$ film Ta:N=71 at %:29 at %) 13 having a thickness of 45 nm on the transparent substrate 11. These film forming conditions are the same as those in the Example 2-3 and the film composition is also the same. Then, using a Ta target, reactive sputtering (DC sputtering) was carried out by setting the power of a DC power supply to 0.7 kW in a mixed gas atmosphere of argon (Ar) and oxygen (O$_2$) (gas flow rate ratio Ar:O$_2$=64:36), thereby forming the front-surface antireflection layer (Ta$_a$O$_b$ film Ta:O=42 at %:58 at %) 14 having a thickness of 13 nm on the light-shielding layer 13. In this manner, there was manufactured a binary mask blank with the light-shielding film 12 having the laminated structure of the light-shielding layer 13 and the front-surface antireflection layer 14.

This mask blank had an optical density of 3 or more for ArF exposure light and had a front-surface reflectance of 19.5% and a back-surface reflectance of 30.3%, which are the optical properties sufficient for a binary mask blank. Since the Ta$_a$O$_b$ film as the front-surface antireflection layer 14 is originally oxidized, an altered layer due to ArF exposure light hardly grows and thus the necessity for adjusting the film forming conditions using the relative density as an index is low.

(Manufacture of MoSi-based Light-Shielding Film Mask Blank)

Next, a description will be given of a binary mask blank having a light-shielding film formed of materials composed mainly of Mo and Si, wherein the light-shielding film has a structure with the properties such that the front-surface reflectance and the back-surface reflectance for ArF exposure light are not greater than predetermined values.

As shown in FIG. 3, this light-shielding film is a light-shielding film 12 having a structure in which a back-surface antireflection layer 15, a light-shielding layer 13, and a front-surface antireflection layer 14 are laminated in this order from the transparent substrate 11 side, wherein the back-surface antireflection layer 15 is formed of Mo$_a$Si$_b$N$_c$, the light-shielding layer 13 is formed of Mo$_x$Si$_y$, and the front-surface antireflection layer 14 is formed of Mo$_e$Si$_f$O$_g$N$_h$. A method of manufacturing the light-shielding film 12 will be shown hereinbelow.

Using a mixed target of molybdenum (Mo) and silicon (Si) (Mo:Si=4 at %:96 at %), reactive sputtering (DC sputtering) was carried out by setting the power of a DC power supply to 3.0 kW in a mixed gas atmosphere of argon (Ar), nitrogen (N$_2$), and helium (He) (gas flow rate ratio Ar:N$_2$:He=6:11:16) at a gas pressure of 0.1 Pa, thereby forming the back-surface antireflection layer (Mo$_a$Si$_b$N$_c$ film Mo:Si:N=2.3 at %:56.5 at %:41.2 at %) 15 having a thickness of 12 nm on the transparent substrate 11. Then, using a mixed target of molybdenum (Mo) and silicon (Si) (Mo:Si=21.3 at %78.7 at %), reactive sputtering (DC sputtering) was carried out by setting the power of a DC power supply to 2.0 kW in a mixed gas atmosphere of argon (Ar) and methane (CH$_4$) (gas flow rate ratio Ar:CH$_4$=92:8) at a gas pressure of 0.203 Pa, thereby forming the light-shielding layer (Mo$_a$Si$_b$ film) 13 having a thickness of 31 nm on the back-surface antireflection layer 15. These film forming conditions are the same as those in the Example 3-2. Then, using a mixed target of molybdenum (Mo) and silicon (Si) (Mo:Si=4 at %:96 at %), reactive sputtering (DC sputtering) was carried out by setting the power of a DC power supply to 3.0 kW in a mixed gas atmosphere of argon (Ar), oxygen (O$_2$), nitrogen (N$_2$), and helium (He) (gas flow rate ratio Ar:O$_2$:N$_2$:He=6:5:11:16) at a gas pressure of 0.1 Pa, thereby forming the front-surface antireflection layer (Mo$_e$Si$_f$O$_g$N$_h$ film Ma:Si:O:N=2.6 at %:57.1 at %:15.9 at %:24.4 at %) 14 having a thickness of 15 nm on the light-shielding layer 13. In this manner, there was manufactured a binary mask blank with the light-shielding film 12 having the three-layer laminated structure of the back-surface antireflection layer 15, the light-shielding layer 13, and the front-surface antireflection layer 14.

This mask blank had an optical density of 3 or more for ArF exposure light and had a front-surface reflectance of 18.8% and a back-surface reflectance of 9.6%, which are the optical properties sufficient for a binary mask blank. Since each of the Mo$_e$Si$_f$O$_g$N$_h$ film as the front-surface antireflection layer 14 and the $Mo_aSi_bN_c$ film as the back-surface antireflection layer 15 has a low content of Mo and is highly oxidized or highly nitrided, an alterated layer due to ArF exposure light hardly grows. Accordingly, the necessity for adjusting the film forming conditions using the relative density as an index is low.

(Manufacture of Ta-Based Transfer Mask)

Next, a description will be given of the manufacture of a transfer mask using the above-mentioned Ta-based light-shielding film mask blank.

Figure 4:
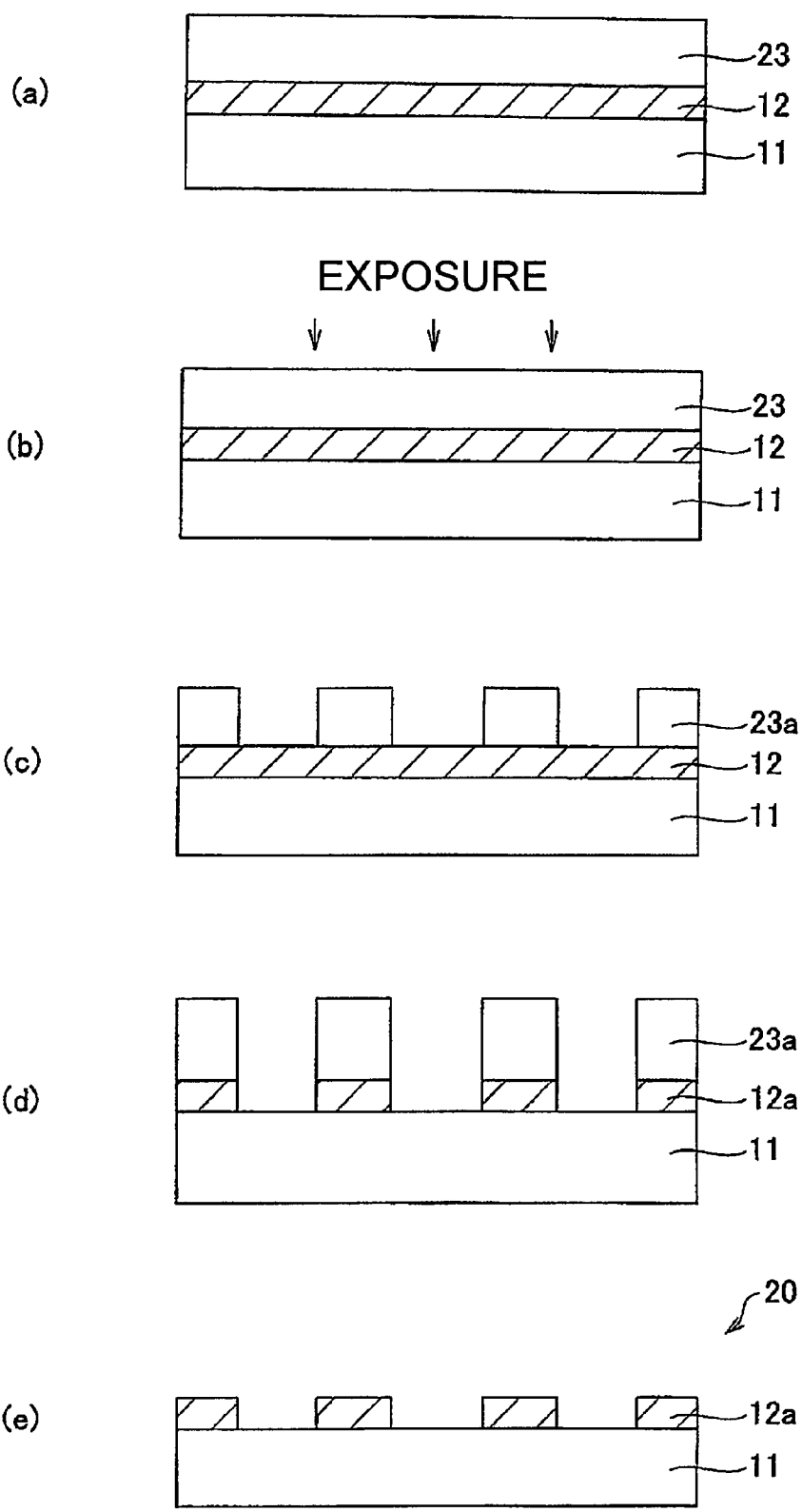
FIG. 4 shows cross-sectional views illustrating an Example of a transfer mask according to this invention.
Figure 5:
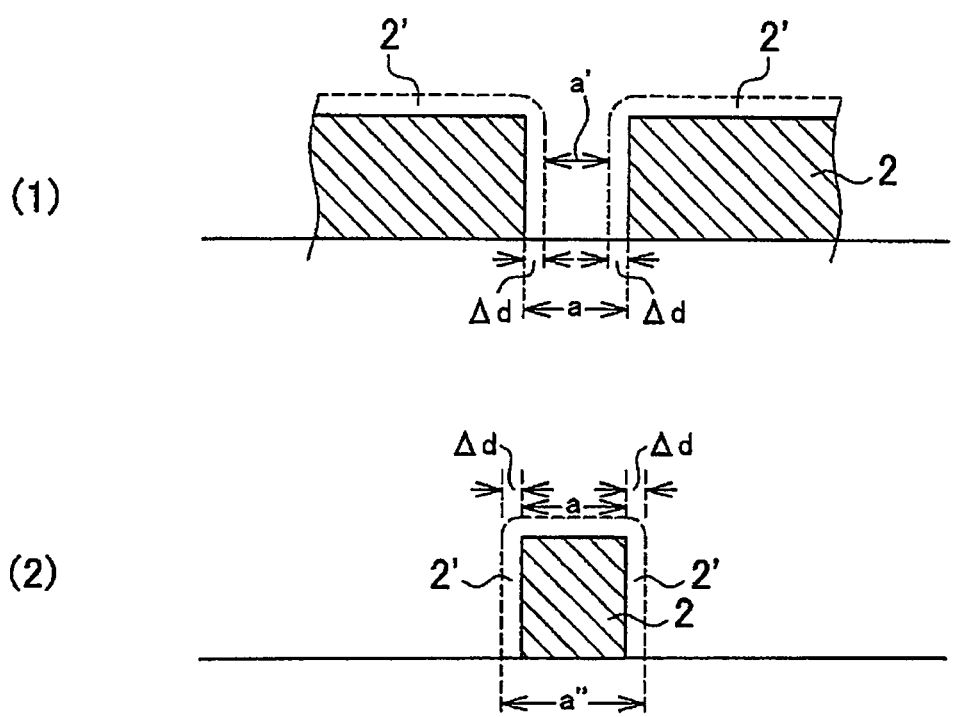
FIG. 5 shows exemplary diagrams for explaining an increase in the line width of a transfer pattern due to an altered layer.

As shown in FIG. 4 (a), a resist film (chemically amplified resist for electron beam writing PRL009: manufactured by FUJIFILM Electronic Materials Co., Ltd.) 23 is spin-coated on the light-shielding film 12. As described with reference to FIGS. 2 and 3, the light-shielding film 12 comprises the light-shielding layer 13 and the front-surface antireflection layer 14.

Then, as shown in FIGS. 4 (b) and (c), a required pattern is exposed on the resist film 23 and, thereafter, the resist film 23 is developed with a predetermined developer, thereby forming a resist pattern 23a.

Then, as shown in FIG. 4 (d), using the resist pattern 23a as a mask, the light-shielding film 12 is dry-etched such that the front-surface antireflection layer 14 is dry-etched using a fluorine-based gas ($CHF_3$ or the like) while the light-shielding layer 13 is dry-etched using a chlorine gas ($Cl_2$ or the like), thereby forming a light-shielding film pattern 12a.

Finally, as shown in FIG. 4 (e), the remaining resist pattern is stripped, thereby obtaining a transfer mask 20.

Since the light-shielding layer in the form of the $Ta_xN_y$ film has a relative density of 83.7% and thus has high denseness, the transfer mask of this invention has durability to exposure light as an ArF excimer laser. As a consequence, the dimensional change of the mask is small and thus its lifetime is long so that high reliability can be obtained.

(Manufacture of Mosi-Based Transfer Mask)

Next, a description will be given of the manufacture of a transfer mask using the above-mentioned MoSi-based light-shielding film mask blank.

As shown in FIG. 4 (a), a resist film (chemically amplified resist for electron beam writing PRL009: manufactured by FUJIFILM Electronic Materials Co., Ltd.) 23 is spin-coated on the light-shielding film 12.

Then, as shown in FIGS. 4 (b) and (c), a required pattern is exposed on the resist film 23 and, thereafter, the resist film 23 is developed with a predetermined developer, thereby forming a resist pattern 23a.

Then, as shown in FIG. 4 (d), using the resist pattern 23a as a mask, the light-shielding film 12 is dry-etched using a fluorine-based gas ($SF_6$ or the like), thereby forming a light-shielding film pattern 12a.

Finally, as shown in FIG. 4 (e), the remaining resist pattern is stripped, thereby obtaining a transfer mask 20.

Since the light-shielding layer in the form of the $Mo_aSi_b$ film has a relative density of 97.6% and thus has high denseness, the transfer mask of this invention has durability to exposure light as an ArF excimer laser. As a consequence, the dimensional change of the mask is small and thus its lifetime is long so that high reliability can be obtained.

In the Ta-based light-shielding film mask blank and the Ta-based transfer mask, as a material of the front-surface antireflection layer 14, use can be made of, for example, other than that shown above, $Ta_xN_y$ (only a highly nitrided material), $Ta_xO_yN_z$, $Ta_xB_yO_z$, $Ta_xB_yN_z$, $Ta_wB_xO_yN_z$, $Ta_xC_yN_z$, $Ta_xC_yO_z$, $Ta_wC_xO_yN_z$, or the like.

In the Ta-based light-shielding film mask blank and the Ta-based transfer mask, the above-mentioned Example shows the light-shielding film having the structure in which the light-shielding layer 13 and the front-surface antireflection layer 14 are laminated in this order from the transparent substrate 11 side. However, the light-shielding film is not limited to this structure and, for example, it may have a structure, as shown in FIG. 3, in which a back-surface antireflection layer 15 is further provided between the transparent substrate 11 and the light-shielding layer 13. In this case, a material of the back-surface antireflection layer 15 may be selected from the above-mentioned materials applicable to the front-surface antireflection layer 14.

In the MoSi-based light-shielding film mask blank and the MoSi-based transfer mask, as a material of each of the front-surface antireflection layer 14 and the back-surface antireflection layer 15, use can be made of, for example, other than that shown above, $Mo_xSi_yN_z$ (only a highly nitrided material), $Mo_wSi_xO_yN_z$, $Mo_wSi_xB_yO_z$, $Mo_wSi_xB_yN_z$, $Mo_vSi_wB_xO_yN_z$, $Mo_wSi_xC_yN_z$, $Mo_wSi_xC_yO_z$, $Mo_vSi_wC_xO_yN_z$, or the like.

In the MoSi-based light-shielding film mask blank and the MoSi-based transfer mask, the above-mentioned Example shows the light-shielding film having the structure in which the back-surface antireflection layer 15, the light-shielding layer 13, and the front-surface antireflection layer 14 are laminated in this order from the transparent substrate 11 side. However, the light-shielding film is not limited to this structure and, for example, it may have a structure, as shown in FIG. 2, in which the back-surface antireflection layer 15 is not provided. In this case, however, as a material of the light-shielding layer 13, it is preferable to use a material containing nitrogen, such as, for example, $Mo_xSi_yN_z$, $Mo_wSi_xB_yN_z$, or $Mo_wSi_xC_yN_z$.

(Thin Film Denseness Evaluation Method)

A thin film denseness evaluation method of this invention is a method for evaluating the denseness of a thin film of a mask blank having the thin film on a transparent substrate, which comprises setting an actual density of the thin film to d1, setting a theoretical density calculated from a material composition of the thin film to d2, calculating d (relative density)=(d1/d2)×100 from the actual density d1 and the theoretical density d2, and evaluating the denseness of the thin film by the relative density d.

It is preferable that an XRR calculated density calculated by the XRR method be used as the actual density of the thin film.

Using the relative density d of this invention, the denseness of the thin film can be quantitatively evaluated without being affected by the film composition, which is very effective for improving the production management and the reliability.

DESCRIPTION OF SYMBOLS 11 transparent substrate
12 thin film (light-shielding film)
12a light-shielding film pattern
13 light-shielding layer
14 front-surface antireflection layer
15 back-surface antireflection layer
20 transfer mask
23 resist film
23a resist pattern

The invention claimed is:

1. A mask blank for use in the manufacture of a transfer mask adapted to be applied with ArF exposure light, the mask blank having a thin film for forming a transfer pattern on a transparent substrate, wherein the thin film is made of a material containing tantalum (Ta), and when an actual density of the thin film is given by d1 and a theoretical density calculated from a film composition of the thin film is given by d2, a relative density d of the thin film given by d=(d1/d2)×100 is greater than 83%.

2. The mask blank according to claim 1, wherein the thin film is made of the material comprising the tantalum (Ta) as a main component and one or more elements selected from boron (B), carbon (C), nitrogen (N), and oxygen (O).

3. The mask blank according to claim 1, wherein the actual density d1 of the thin film is an XRR calculated density calculated by an XRR method.

4. The mask blank according to claim 1, wherein the thin film is a light-shielding film adapted to shield the exposure light and the light-shielding film has a structure in which a light-shielding layer and a front-surface antireflection layer are laminated in this order from the transparent substrate side.

5. The mask blank according to claim 4, wherein the light-shielding film has a back-surface antireflection layer between the transparent substrate and the light-shielding layer.

6. A transfer mask having a transfer pattern formed in the thin film of the mask blank according to claim 1.

7. A mask blank for use in the manufacture of a transfer mask adapted to be applied with ArF exposure light, the mask blank having a thin film for forming a transfer pattern on a transparent substrate,
wherein the thin film is made of a material containing silicon (Si) and a transition metal, and
when an actual density of the thin film is given by d1 and a theoretical density calculated from a film composition of the thin film is given by d2, a relative density d of the thin film given by d=(d1/d2)×100 is greater than 94%.

8. The mask blank according to claim 7, wherein the thin film comprises the silicon (Si) and one or more transition metals selected from titanium (Ti), vanadium (V), niobium (Nb), molybdenum (Mo), zirconium (Zr), ruthenium (Ru), rhodium (Rh), chromium (Cr), nickel (Ni), hafnium (Hf), tantalum (Ta), and tungsten (W).

9. The mask blank according to claim 7, wherein the actual density d1 of the thin film is an XRR calculated density calculated by an XRR method.

10. The mask blank according to claim 7, wherein the thin film is a light-shielding film adapted to shield the exposure light and the light-shielding film has a structure in which a light-shielding layer and a front-surface antireflection layer are laminated in this order from the transparent substrate side.

11. The mask blank according to claim 10, wherein the light-shielding film has a back-surface antireflection layer between the transparent substrate and the light-shielding layer.

12. A transfer mask having a transfer pattern formed in the thin film of the mask blank according to claim 7.

13. A film denseness evaluation method for evaluating a denseness of a thin film of a mask blank having the thin film on a transparent substrate, which comprises
setting an actual density of the thin film to d1,
analyzing a material composition of the thin film,
setting a theoretical density calculated from the material composition of the thin film to d2,
calculating a relative density d from the actual density d1 and the theoretical density d2 according to d=(d1/d2)×100, and
evaluating the denseness of the thin film by the relative density d.

14. The film denseness evaluation method according to claim 13, wherein the actual density d1 of the thin film is an XRR calculated density calculated by an XRR method.

* * * * *